United States Patent
Guo et al.

(10) Patent No.: US 9,967,987 B2
(45) Date of Patent: May 8, 2018

(54) ELECTRONIC DEVICE ENCLOSURE AND ELECTRONIC DEVICE

(71) Applicant: Huawei Device Co., Ltd., Shenzhen (CN)

(72) Inventors: Junsheng Guo, Shenzhen (CN); Lue Sun, Shenzhen (CN)

(73) Assignee: Huawei Device Co., Ltd., Shenzhen (CN)

( * ) Notice: Subject to any disclaimer, the term of this patent is extended or adjusted under 35 U.S.C. 154(b) by 0 days. days.

(21) Appl. No.: 14/822,643

(22) Filed: Aug. 10, 2015

(65) Prior Publication Data

US 2015/0351265 A1    Dec. 3, 2015

Related U.S. Application Data

(63) Continuation of application No. PCT/CN2014/075258, filed on Apr. 14, 2014.

(30) Foreign Application Priority Data

May 14, 2013    (CN) .......................... 2013 1 0177846

(51) Int. Cl.
*H05K 5/02*    (2006.01)

(52) U.S. Cl.
CPC ...... *H05K 5/0213* (2013.01); *Y10T 29/49004* (2015.01)

(58) Field of Classification Search
CPC .................................................. H05K 5/0213
USPC ................... 361/679.46, 679.49; 454/184
See application file for complete search history.

(56) References Cited

U.S. PATENT DOCUMENTS

| 7,362,570 B2* | 4/2008 | Su .................. H05K 5/0213 224/673 |
| 2006/0087210 A1* | 4/2006 | Kim .................. H05K 5/0213 313/24 |
| 2008/0101041 A1* | 5/2008 | Chang .................. H05K 5/0213 361/728 |
| 2009/0161310 A1 | 6/2009 | Peng et al. |
| 2011/0009046 A1* | 1/2011 | Kankkunen .............. G06F 1/20 454/184 |
| 2012/0322357 A1 | 12/2012 | Zhang et al. |

FOREIGN PATENT DOCUMENTS

| CN | 1708211 | 12/2005 |
| CN | 1766959 A | 5/2006 |
| CN | 101470482 | 7/2009 |
| CN | 202134169 | 2/2012 |
| CN | 102833964 | 12/2012 |

(Continued)

*Primary Examiner* — Mukund G Patel
(74) *Attorney, Agent, or Firm* — Slater Matsil, LLP

(57) ABSTRACT

The present invention discloses an electronic device enclosure and an electronic device. The electronic device enclosure includes: a housing enclosing an exterior of an electronic component; and a baffle plate which is away from the housing by a preset distance and is disposed on an inner side of the housing, where at least one opening is disposed on each of the housing and the baffle plate, where positions of the opening of the baffle plate and the opening of the housing are mutually staggered in a perpendicular direction, and the opening of the housing faces a non-opening area of the baffle plate in the perpendicular direction.

12 Claims, 4 Drawing Sheets

(56) References Cited

FOREIGN PATENT DOCUMENTS

| | | |
|---|---|---|
| DE | 10050326 | 5/2002 |
| JP | S50028237 U | 3/1975 |
| JP | S6170972 U | 5/1986 |
| JP | 02110998 A | 4/1990 |
| JP | H06327121 A | 11/1994 |
| JP | H09260878 A | 10/1997 |
| JP | H09307247 A | 11/1997 |
| JP | H11004393 A | 1/1999 |
| JP | 2006119595 A | 5/2006 |
| JP | 2008233177 A | 10/2008 |

* cited by examiner

ELECTRONIC DEVICE ENCLOSURE AND ELECTRONIC DEVICE

This application is a continuation of International Application No. PCT/CN2014/075258, filed on Apr. 14, 2014, which claims priority to Chinese Patent Application No. 201310177846.8, filed on May 14, 2013, both of which are hereby incorporated by reference in their entireties.

TECHNICAL FIELD

The present invention relates to the field of electronics technologies, and in particular, to an electronic device enclosure and an electronic device.

BACKGROUND

An enclosure of an existing electronic device, for example, a home terminal product such as a television, a set-top box, and a gateway, usually uses openings for heat dissipation. In daily use, lots of dust may enter an interior of the electronic device from the openings of the electronic device enclosure, so that an electronic component inside the electronic device gathers dust. If a large amount of dust is accumulated in the electronic component inside the electronic device for a long time, corrosion of the electronic component may be caused and problems such as a short circuit may occur, causing that a electronic product cannot work properly, and in a long run, a service life of the electronic product may further be affected.

As such, an existing enclosure uses openings for heat dissipation, and a problem occurs that a large amount of dust easily gets inside the enclosure.

SUMMARY

In view of this, the present invention provides an electronic device enclosure and an electronic device.

According to a first aspect, an electronic device enclosure is provided, including: a housing enclosing an exterior of an electronic component; and a baffle plate which is away from the housing by a preset distance and is disposed on an inner side of the housing; where at least one opening is disposed on each of the housing and the baffle plate, where positions of the opening of the baffle plate and the opening of the housing are mutually staggered in a perpendicular direction, and the opening of the housing faces a non-opening area of the baffle plate in the perpendicular direction.

In a first possible implementation manner of the first aspect, on the baffle plate, protrusions are disposed around a periphery of the opening.

With reference to the first possible implementation manner of the first aspect, in a second possible implementation manner, a height of the protrusions is less than the preset distance between the housing and the baffle plate.

With reference to the first possible implementation manner of the first aspect, in a third possible implementation manner, at least one guide groove is disposed on the baffle plate.

With reference to the third possible implementation manner of the first aspect, in a fourth possible implementation manner, a guide hole is disposed at a bottom position where the guide groove and the housing are connected, which is used to enable a foreign matter that enters from the opening on the housing to flow out of the housing from the guide hole after passing a trench, which is formed between the protrusions, and the guide groove.

According to a second aspect, an electronic device is provided, including the electronic device enclosure with reference to the foregoing first aspect or any one implementation manner of the first possible implementation manner to the fourth possible implementation manner of the first aspect, where an electronic component of the electronic device is disposed inside the electronic device enclosure.

In the electronic device enclosure according to the embodiments of the present invention, a housing and a baffle plate of the electronic device enclosure each have an opening, positions of the opening of the baffle plate and the opening of the housing are mutually staggered in a perpendicular direction, and the opening of the housing faces a non-opening area of the baffle plate in the perpendicular direction. Therefore, heat generated during an operating process of an electronic component inside the electronic device can be expelled out of the housing, and meanwhile, dust falling onto the electronic component inside the electronic device can further be reduced effectively, thereby ensuring normal operation of the electronic device and extending a service life of the electronic device.

Other characteristics and aspects of the present invention will become clear according to the following detailed descriptions of exemplary embodiments with reference to the accompany drawings.

BRIEF DESCRIPTION OF DRAWINGS

Accompanying drawings included in the specification and constituting a part of the specification illustrate, together with the specification, exemplary embodiments, characteristics, and aspects of the present invention, and are used to explain the principle of the present invention.

DETAILED DESCRIPTION OF ILLUSTRATIVE EMBODIMENTS

A detailed reference will be given for embodiments of the present invention. Although the present invention is clarified and described by using these embodiments, it should be noted that the present invention is not merely limited to these embodiments. On the contrary, the present invention covers all replacements, variations, and equivalents within the spirit and scope of the present invention defined by the attached claims.

The specific word "exemplary" herein means "being used as an example or embodiment, or for description". Any embodiment described as "exemplary" herein is not necessarily interpreted as being superior to or better than other embodiments.

Further, in order to describe the present invention in a better way, many specific details are given in the following specific embodiments. A person skilled in the art should understand that, the present invention can still be implemented without these details. In some other embodiments, well-known methods, means, components and circuits are not described in detail, so as to highlight the subject of the present invention.

Figure 1:
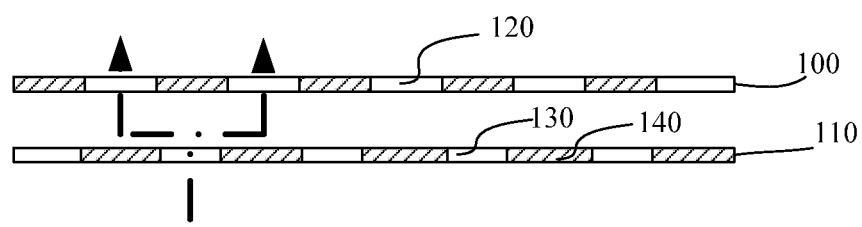
FIG. 1 is a schematic cross-sectional diagram of an electronic device enclosure according to an embodiment of the present invention.

FIG. 1 is a schematic cross-sectional diagram of an electronic device enclosure according to an embodiment of the present invention. As shown in FIG. 1, the electronic device enclosure may include: a housing 100 enclosing an exterior of an electronic component; and a baffle plate 110 which is away from the housing 100 by a preset distance and is disposed on an inner side of the housing 100, where at least one opening is disposed on each of the housing 100 and the baffle plate 110. In this way, heat generated during an operating process of an electronic component inside the electronic device may pass an opening 130 of the baffle plate 110, and then be expelled out of the housing 100 from an opening 120 of the housing 100. The numbers of openings of the housing 100 and the baffle plate 110 are not limited. Generally, the more the openings are, the better an effect of heat dissipation will be.

In addition, positions of the opening 130 of the baffle plate 110 and the opening 120 of the housing 100 are mutually staggered in a perpendicular direction, and the opening 120 of the housing 100 faces a non-opening area 140 of the baffle plate 110 in the perpendicular direction. In this way, if dust enters an interior of the electronic device from the opening 120 of the housing 100, the dust may fall on the non-opening area 140 of the baffle plate 110, thereby blocking the dust from falling on an electronic component inside the electronic device.

In the electronic device enclosure of the present invention, a housing and a baffle plate of the electronic device enclosure each have an opening, positions of the opening of the baffle plate and the opening of the housing are mutually staggered in a perpendicular direction, and the opening of the housing faces a non-opening area of the baffle plate in the perpendicular direction. Therefore, heat generated during an operating process of an electronic component inside the electronic device can be expelled out of the housing, and meanwhile, dust falling onto the electronic component inside the electronic device can further be reduced effectively, thereby ensuring normal operation of the electronic device and extending a service life of the electronic device.

Figure 2A:
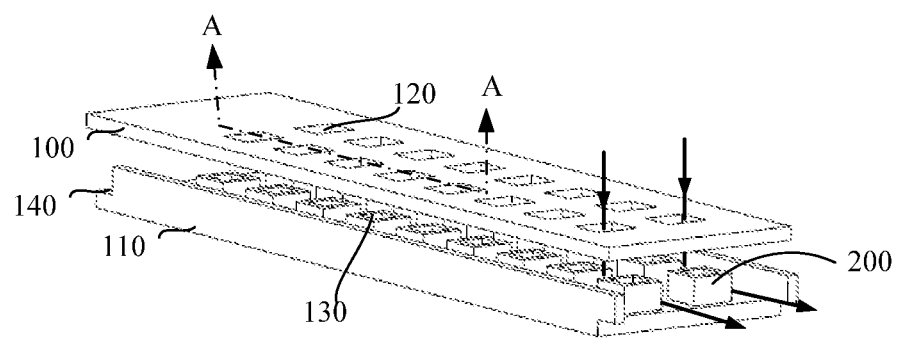
FIG. 2a is a three-dimensional diagram of a baffle plate of an electronic device enclosure according to another embodiment of the present invention.
Figure 2B:
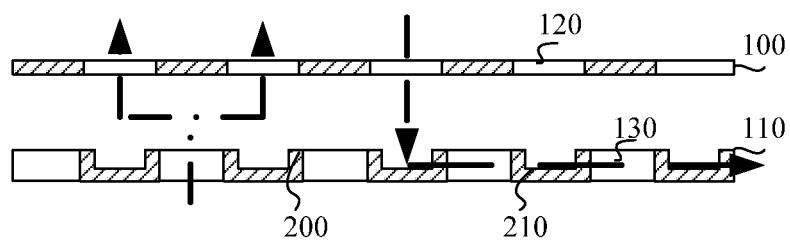
FIG. 2b is a schematic cross-sectional diagram of the baffle plate of the electronic device enclosure in an A-A direction according to the another embodiment of the present invention.

FIG. 2a is a three-dimensional diagram of a baffle plate of an electronic device enclosure according to another embodiment of the present invention, and FIG. 2b is a schematic cross-sectional diagram of the baffle plate of the electronic device enclosure in an A-A direction according to the another embodiment of the present invention. Elements in FIG. 2a and FIG. 2b have same functions as those labeled with same numbers in FIG. 1. For brevity, detailed descriptions of these elements are omitted.

As shown in FIG. 2a and FIG. 2b, a main difference from the foregoing embodiment lies in that, on the baffle plate 110, protrusions 200 are disposed around a periphery of the opening 130, so as to form a trench 210 on the baffle plate 110 in addition to the opening 130 and the protrusions 200. When a foreign matter, for example, liquid or dust, enters an interior of the electronic device from the opening 120 of the housing 100 of the electronic device enclosure, the foreign matter will fall into the trench 210. The protrusions 200 of the baffle plate 110 can well block the liquid or dust from falling onto an electronic component inside the electronic device.

A height of the protrusions 200 is less than the preset distance between the housing 100 and the baffle plate 110. On this premise, the higher the protrusions 200 are, the higher the trench 210 between the protrusions 200 of the baffle plate 110 is, and the better the effect of blocking the dust or liquid from entering the opening 120 of the housing 100 will be.

In addition, internal air of the electronic device can go up or down along space of the protrusions, and an enhanced air convection is formed. A very obvious chimney effect is generated, and heat on top of the protrusions is driven to be expelled out as quickly as possible from the opening of the housing.

The electronic device enclosure of the embodiment of the present invention may be applied to a vehicle-mounted electronic product. For the vehicle-mounted electronic product, the electronic device enclosure is used to prevent a foreign liquid matter in a vehicle, such as mineral water, cola, and coffee, from splashing onto the electronic product during a running process of the vehicle. Further, these electronic products usually require a temperature above 70° C. so as to work normally. Therefore, by using the electronic device enclosure of the embodiment of the present invention, heat can be dissipated by means of openings, and water and dust can be prevented. The electronic device enclosure of the embodiment of the present invention is also applicable to many home terminals, such as a television, a set-top box, and a gateway. In daily use, these terminals may easily encounter a problem of cup tipping or everyday dust gathering. By using the electronic device enclosure of the embodiment of the present invention, heat can be dissipated by means of openings, and water and dust can be prevented.

In the electronic device enclosure of the present invention, a housing and a baffle plate of the electronic device enclosure each have an opening, positions of the opening of the baffle plate and the opening of the housing are mutually staggered in a perpendicular direction, and the opening of the housing faces a non-opening area of the baffle plate in the perpendicular direction. Therefore, heat generated during an operating process of an electronic component inside the electronic device can be expelled out of the housing, and meanwhile, dust falling onto the electronic component inside the electronic device can further be reduced effectively, thereby ensuring normal operation of the electronic device and extending a service life of the electronic device. In addition, a trench that is disposed on the baffle plate and between protrusions disposed around a periphery of openings can block liquid from falling onto an electronic component inside the electronic device, and prevent the electronic component from being damaged due to entry of liquid, thereby further ensuring normal operation of the electronic device and extending the service life of the electronic device. In addition, the protrusions can generate a chimney effect and improve an effect of heat dissipation.

Figure 3A:
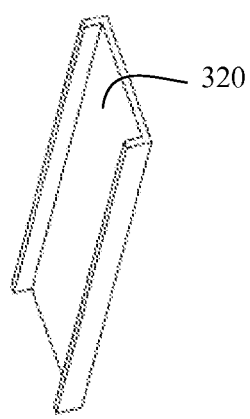
FIG. 3a is a schematic structural diagram of a guide groove of a baffle plate of an electronic device enclosure according to yet another embodiment of the present invention.
Figure 3B:
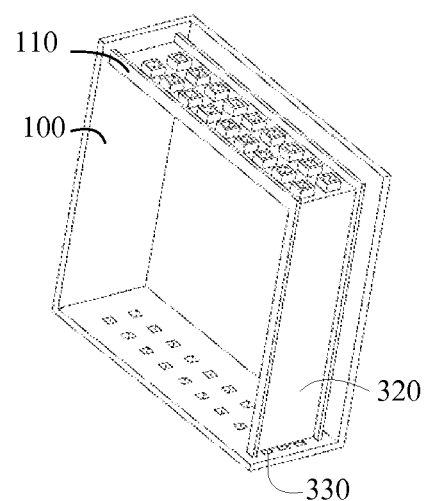
FIG. 3b is a schematic structural diagram of the baffle plate of the electronic device enclosure according to the yet another embodiment of the present invention.

FIG. 3a is a schematic structural diagram of a guide groove of a baffle plate of an electronic device enclosure according to yet another embodiment of the present invention, and FIG. 3b is a schematic structural diagram of the baffle plate of the electronic device enclosure according to the yet another embodiment of the present invention. Elements in FIG. 3a and FIG. 3b have same functions as those labeled with same numbers in FIG. 1, FIG. 2a, and FIG. 2b. For brevity, detailed descriptions of these elements are omitted.

As shown in FIG. 3a and FIG. 3b, a main difference from the foregoing embodiment lies in that, at least one guide groove 320 is disposed on the baffle plate 110 of the electronic device enclosure. In the embodiment of the present invention, a foreign matter, such as water, enters an interior of the electronic device from the opening 120 of the housing 100, falls into the trench 210 between protrusions 200 of the baffle plate 110, and flows to the guide groove 320 disposed on the baffle plate 110 after passing the trench 210, to flow out of the housing 100.

The baffle plate 110 may also be disposed to form a certain angle, for example 0-30 degrees, with one face of the housing 100. In this way, when this face of the baffle plate 110 is a top face, it is easier for a foreign matter, such as liquid and/or dust, to fall into the trench 210 of the baffle plate 110. The guide groove 320 of the baffle plate 110 may also be disposed to form a certain angle, for example 0-30 degrees, with another face of the housing 100. In this way, liquid and/or dust can slowly flow down from top of the guide groove 320.

Further, a guide hole 330 is disposed at a bottom position where the guide groove 320 and the housing 100 are connected, to enable a foreign matter that enters from the opening 120 on the housing 100 to flow out of the housing 100 from the guide hole 330 after passing the trench 210, which is formed between the protrusions 200, and the guide groove 320.

Figure 3C:
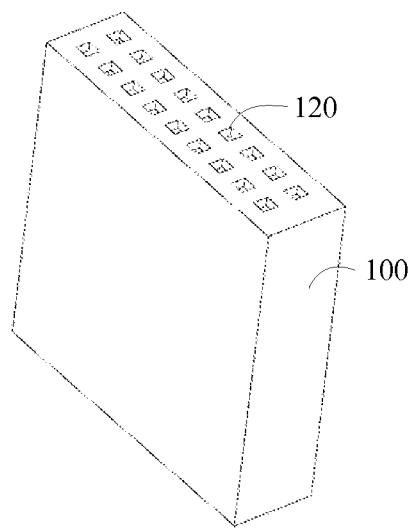
FIG. 3c is a schematic structural diagram of top face openings of the electronic device enclosure according to the yet another embodiment of the present invention.
Figure 3D:
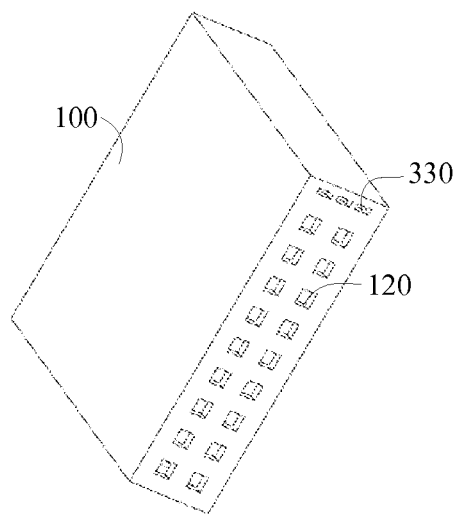
FIG. 3d is a schematic structural diagram of bottom face openings of the electronic device enclosure according to the yet another embodiment of the present invention.

In addition, the housing 100 of the electronic device enclosure may be formed by multiple faces. The opening of the housing 100 may be on one face or may be on multiple faces, and the face where the opening is disposed may be a top face, a bottom face, or a side face, or all faces may have openings, which are specifically determined according to an actual application requirement. As shown in FIG. 3c, FIG. 3c is a schematic structural diagram of top face openings of an electronic device enclosure according to the yet another embodiment of the present invention. As shown in FIG. 3d, FIG. 3d is a schematic structural diagram of bottom face openings of the electronic device enclosure according to the yet another embodiment of the present invention. Elements in FIG. 3c and FIG. 3d have same functions as those labeled with same numbers in FIG. 1, FIG. 2, and FIG. 3a to FIG. 3b. For brevity, detailed descriptions of these elements are omitted.

Figure 3E:
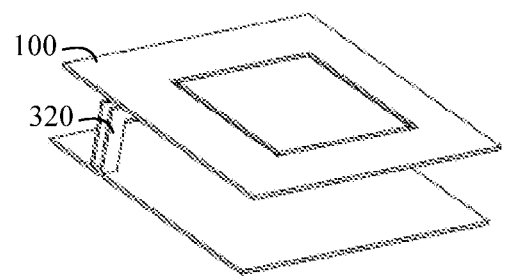
FIG. 3e to FIG. 3g are schematic structural diagrams of a shape of an opening of the electronic device enclosure according to the yet another embodiment of the present invention.
Figure 3F:
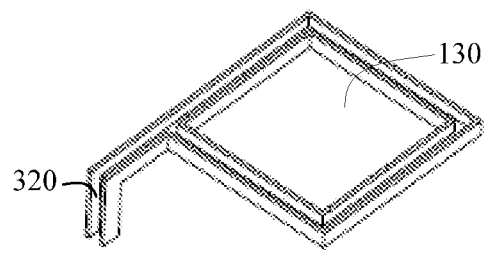
Figure 3G:
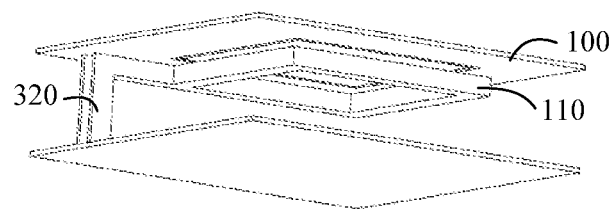

In addition, a shape of the opening is not limited to a circle or a square, and may also be another shape. A specific shape of the opening is not limited in the embodiment of the present invention. For example, FIG. 3e to FIG. 3g are schematic structural diagrams of an opening shape of the electronic device enclosure according to the yet another embodiment of the present invention. Elements in FIG. 3e to FIG. 3g have same functions as those labeled with same numbers in FIG. 1, FIG. 2, and FIG. 3a to FIG. 3d. For brevity, detailed descriptions of these elements are omitted. As shown in FIG. 3e to FIG. 3g, the opening may also be in a shape of a hollow square, as long as it is ensured that positions of the opening 130 of the baffle plate 110 and the opening 120 of the housing 100 are mutually staggered in a perpendicular direction, and that the opening 120 of the housing 100 faces the non-opening area 140 of the baffle plate 110 in the perpendicular direction.

In the electronic device enclosure of the present invention, a housing and a baffle plate of the electronic device enclosure each have an opening, positions of the opening of the baffle plate and the opening of the housing are mutually staggered in a perpendicular direction, and the opening of the housing faces a non-opening area of the baffle plate in the perpendicular direction. Therefore, heat generated during an operating process of an electronic component inside the electronic device can be expelled out of the housing, and meanwhile, dust falling onto the electronic component inside the electronic device can further be reduced effectively, thereby ensuring normal operation of the electronic device and extending a service life of the electronic device. A trench that is disposed on the baffle plate and between protrusions disposed around a periphery of openings can block liquid from falling onto an electronic component inside the electronic device, which prevents the electronic component from being damaged due to entry of liquid, thereby further ensuring normal operation of the electronic device and extending the service life of the electronic device. Meanwhile, the protrusions can generate a chimney effect and improve an effect of heat dissipation. In addition, a combination of a guide groove with a guide hole enables liquid falling into the electronic device to be expelled from the guide hole through the guide groove, which blocks the liquid from falling onto the electronic component inside the electronic device in a better way, thereby preventing the electronic component from being damaged due to entry of liquid, and further ensuring normal operation of the electronic device and extending the service life of the electronic device.

An embodiment of the present invention embodiment further provides an electronic device, which includes the electronic device enclosure with any one structure in the foregoing embodiments, where an electronic component of the electronic device is disposed inside the electronic device enclosure.

The electronic device of the present invention may use the electronic device enclosure with any one structure of the embodiments of the present invention. An opening is disposed on each of a housing and a baffle plate of the electronic device enclosure, positions of the opening of the baffle plate and the opening of the housing are mutually staggered in a perpendicular direction, and the opening of the housing faces a non-opening area of the baffle plate in the perpendicular direction. Therefore, heat generated during an operating process of an electronic component inside the electronic device can be expelled out of the housing, and meanwhile, dust falling onto the electronic component inside the electronic device can further be reduced effectively, thereby ensuring normal operation of the electronic device and extending a service life of the electronic device. A trench that is disposed on the baffle plate and between protrusions disposed around a periphery of openings can block liquid from falling onto the electronic component inside the electronic device, and prevent the electronic component from being damaged due to entry of liquid, thereby further ensuring normal operation of the electronic device and extending the service life of the electronic device. Further, the protrusions can generate a chimney effect and improve an effect of heat dissipation. In addition, a combination of a guide groove with a guide hole enables liquid falling into the electronic device to be expelled from the guide hole through the guide groove, which blocks the liquid from falling onto the electronic component inside the electronic device in a better way, thereby preventing the electronic component from being damaged due to entry of liquid, and further ensuring normal operation of the electronic device and extending the service life of the electronic device.

The foregoing descriptions are merely specific embodiments of the present invention, and are only used to describe the technical solution of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope defined by the claims.

What is claimed is:

1. An electronic device enclosure comprising:
    a housing enclosing an electronic component;
    a baffle plate inside the housing and positioned a preset distance away from a first side of the housing, wherein each of the baffle plate and the first side of the housing have at least one opening, and locations of the opening of the baffle plate and the opening of the housing are mutually staggered in a perpendicular direction so that the opening of the housing is positioned beside a non-opening area of the baffle plate in the perpendicular direction;
    a second side of the housing opposite to the first side, the second side comprising openings and a guide hole; and
    a guide groove connecting the baffle plate with the second side of the housing so that a foreign matter that enters from the opening on the first side of the housing is able to leave the housing through the guide hole via the guide groove,
    wherein the baffle plate comprises a plurality of openings, and wherein protrusions are disposed around a complete periphery of each opening thereby forming trenches.

2. The electronic device enclosure according to claim 1, wherein a height of the protrusions is less than the preset distance between the housing and the baffle plate.

3. The electronic device enclosure according to claim 1, wherein at least one guide groove is disposed on the baffle plate.

4. The electronic device enclosure according to claim 1, wherein a trench is formed between the protrusions and the guide groove.

5. An electronic device comprising:
    an electronic component; and
    an electronic device enclosure, wherein the electronic component is disposed inside the electronic device enclosure, the electronic device enclosure comprising:
    a housing; and
    a baffle plate inside the housing and positioned away from a first side of the housing by a preset distance, wherein each of the baffle plate and the first side of the housing have at least one opening, and positions of the opening of the baffle plate and the opening of the first side of housing are mutually staggered in a perpendicular direction so that the opening of the first side of housing faces a non-opening area of the baffle plate in the perpendicular direction, wherein the baffle plate comprises a plurality of openings, wherein protrusions are disposed around a complete periphery of each opening thereby forming trenches, and wherein the protrusions face the first side of the housing;
    a second side of the housing opposite to the first side, wherein the second side comprises a guide hole; and
    a guide groove connecting the baffle plate with the second side of the housing so that a foreign matter that enters from the opening on the first side of the housing is able to leave the housing through the guide hole via the guide groove.

6. The electronic device according to claim 5, wherein a height of the protrusions is less than the preset distance between the housing and the baffle plate.

7. The electronic device according to claim 5, wherein at least one guide groove is disposed on the baffle plate.

8. The electronic device according to claim 5, wherein a trench is formed between the protrusions and the guide groove.

9. A method of making an electronic device, the method comprising:
    providing an electronic device enclosure; and
    placing an electronic component inside the electronic device enclosure, the electronic device enclosure comprising:
    a housing; and
    a baffle plate inside the housing and positioned away from a first side of the housing by a preset distance, wherein each of the baffle plate and the first side of the housing have at least one opening, and positions of the opening of the baffle plate and the opening of the first side of housing are mutually staggered in a perpendicular direction so that the opening of the first side of housing faces a non-opening area of the baffle plate in the perpendicular direction, wherein the baffle plate comprises a plurality of openings, wherein protrusions are disposed around a complete periphery of each opening thereby forming trenches, and wherein the protrusions face the first side of the housing;
    a second side of the housing opposite to the first side, wherein the second side comprises a guide hole; and
    a guide groove connecting the baffle plate with the second side of the housing so that a foreign matter that enters from the opening on the first side of the housing is able to leave the housing through the guide hole via the guide groove.

10. The method according to claim 9, wherein a height of the protrusions is less than the preset distance between the housing and the baffle plate.

11. The method according to claim 9, wherein at least one guide groove is disposed on the baffle plate.

12. The method according to claim 9, wherein a trench is formed between the protrusions and the guide groove.

* * * * *